(12) United States Patent
Wong et al.

(10) Patent No.: US 11,700,738 B2
(45) Date of Patent: Jul. 11, 2023

(54) ORGANIC LIGHT-EMITTING DIODE DISPLAY WITH PATTERNED ANODES AND OPTICAL CAVITIES

(71) Applicant: Apple Inc., Cupertino, CA (US)

(72) Inventors: Gloria Wong, Mountain View, CA (US); Jaein Choi, San Jose, CA (US); Sunggu Kang, San Jose, CA (US); Hairong Tang, San Jose, CA (US); Xiaodan Zhu, Los Angeles, CA (US); Wendi Chang, Santa Clara, CA (US); Kanuo C. Kustra, San Jose, CA (US); Rui Liu, San Jose, CA (US); Cheng Chen, San Jose, CA (US); Teruo Sasagawa, Los Gatos, CA (US); Wookyung Bae, San Jose, CA (US)

(73) Assignee: Apple Inc., Cupertino, CA (US)

( * ) Notice: Subject to any disclaimer, the term of this patent is extended or adjusted under 35 U.S.C. 154(b) by 440 days.

(21) Appl. No.: 16/888,451

(22) Filed: May 29, 2020

(65) Prior Publication Data

US 2021/0057670 A1 Feb. 25, 2021

Related U.S. Application Data

(60) Provisional application No. 62/891,142, filed on Aug. 23, 2019.

(51) Int. Cl.
*H01L 51/52* (2006.01)
*H10K 50/824* (2023.01)
*H10K 50/818* (2023.01)
*H10K 59/35* (2023.01)
*H10K 59/121* (2023.01)

(52) U.S. Cl.
CPC ......... *H10K 50/818* (2023.02); *H10K 50/824* (2023.02); *H10K 59/121* (2023.02); *H10K 59/35* (2023.02)

(58) Field of Classification Search
CPC combination set(s) only.
See application file for complete search history.

(56) References Cited

U.S. PATENT DOCUMENTS 8,847,215 B2 9/2014 Park et al.
9,065,079 B2 6/2015 Liu et al.
(Continued)

*Primary Examiner* — Suberr L Chi
(74) *Attorney, Agent, or Firm* — Treyz Law Group, P.C.; Joseph F. Guihan

(57) ABSTRACT

Pixels in an organic light-emitting diode (OLED) display may be microcavity OLED pixels having optical cavities. The optical cavities may be defined by a partially transparent cathode layer and a reflective anode structure. The anode of the pixels may include both the reflective anode structure and a supplemental anode that is transparent and that is used to tune the thickness of the optical cavity for each pixel. Organic light-emitting diode layers may be formed over the pixels and may have a uniform thickness in each pixel in the display. Pixels may have a conductive spacer between a transparent anode portion and a reflective anode portion, without an intervening dielectric layer. The conductive spacer may be formed from a material such as titanium nitride that is compatible with both anode portions. The transparent anode portions may have varying thicknesses to control the thickness of the optical cavities of the pixels.

19 Claims, 6 Drawing Sheets

(56) References Cited

U.S. PATENT DOCUMENTS

| | | |
|---|---|---|
| 2014/0326983 A1 | 11/2014 | Yamazaki et al. |
| 2015/0228932 A1* | 8/2015 | Ma ..................... H01L 51/5044 257/40 |
| 2015/0357592 A1 | 12/2015 | Li et al. |
| 2017/0047550 A1* | 2/2017 | Lee ..................... G09G 3/3266 |
| 2019/0296264 A1* | 9/2019 | Mathai ............... H01L 27/3244 |
| 2020/0035951 A1* | 1/2020 | Cheon ................ H01L 51/5088 |

* cited by examiner

ORGANIC LIGHT-EMITTING DIODE DISPLAY WITH PATTERNED ANODES AND OPTICAL CAVITIES

This application claims the benefit of provisional patent application No. 62/891,142, filed Aug. 23, 2019, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode. To emit light from a given pixel in an organic light-emitting diode display, a voltage may be applied to the anode of the given pixel.

Some OLED pixels may include microcavity OLED pixels, where OLED layers are covered by a partially transparent layer to form an optical cavity. The thickness of the optical cavity may be tuned so that light of a selected wavelength is emitted with high efficiency. However, if care is not taken, OLED pixels of this type may have non-uniform thicknesses, may have smaller than desired aperture ratios, and/or may require complex manufacturing processes.

It is within this context that the embodiments herein arise.

SUMMARY

An electronic device may have a display such as an organic light-emitting diode display. The organic light-emitting diode (OLED) display may have an array of organic light-emitting diode pixels that each have OLED layers interposed between a cathode and an anode.

The pixels in the OLED display may be microcavity OLED pixels having optical cavities. The optical cavities may be defined by a partially transparent cathode layer and a reflective anode structure. The anodes of the pixels may include a supplemental anode that is transparent and that is used to tune the thickness of the optical cavity for each pixel.

White organic light-emitting diode layers may be formed over the pixels and may have a uniform thickness in each pixel in the display. The thickness of the optical cavity of each pixel is controlled using the thickness of the transparent anode stack that includes the supplemental anode and additional spacer layers. Blue pixels, green pixels, and red pixels may have increasingly thick optical cavities.

Blue pixels may have a conductive spacer between a transparent anode portion and a reflective anode portion. The conductive spacer may be formed from a material such as titanium nitride that is compatible with both of the anode portions. No other dielectric layers may be formed between the anode portions of the blue pixels. This means that no vias are required for the blue pixels, increasing the aperture ratios of the blue pixels.

In some arrangements, the transparent anode portions may have varying thicknesses to control the thickness of the optical cavities of the pixels. For example, the transparent anode portions of the red pixels may be thicker than the transparent anode portions of the green or blue pixels. The dielectric layers underneath the transparent anode portions of the red pixels may be thinner in this arrangement, rendering the via through the dielectric layers easier to form.

DETAILED DESCRIPTION

Figure 1:
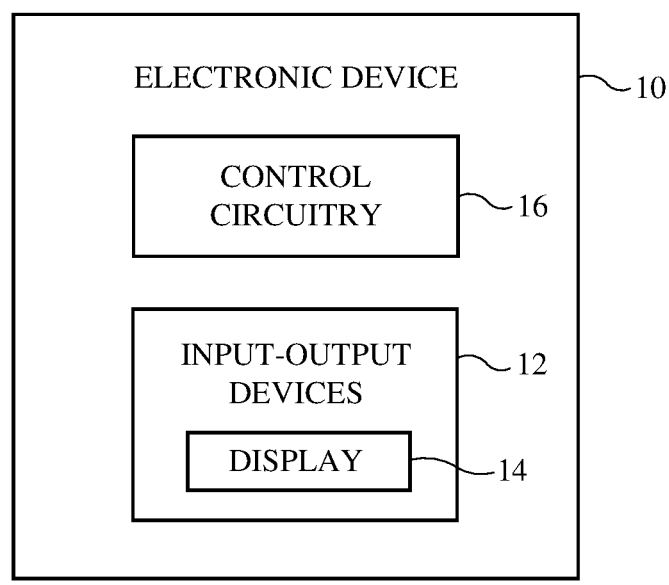
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
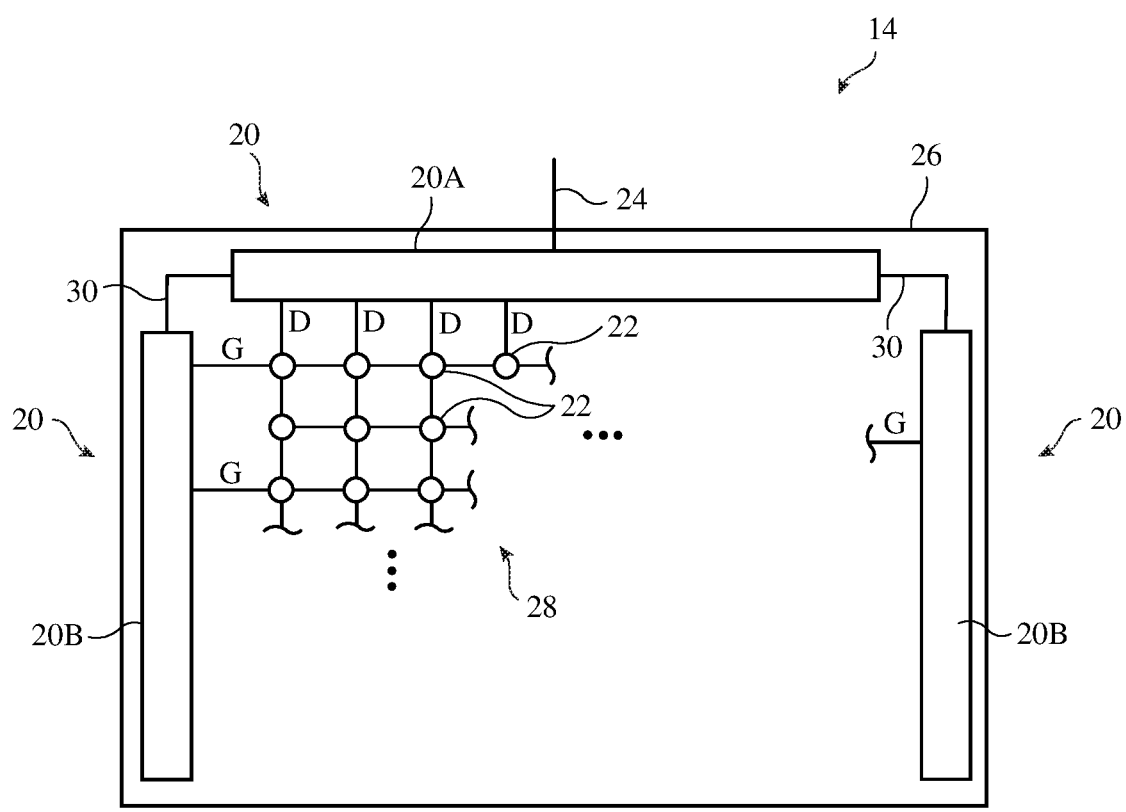
FIG. 2 is a schematic diagram of an illustrative display in accordance with an embodiment.

FIG. 2 is a diagram of an illustrative display 14. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. Pixels of other colors such as cyan, magenta, and yellow might also be used.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally across display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
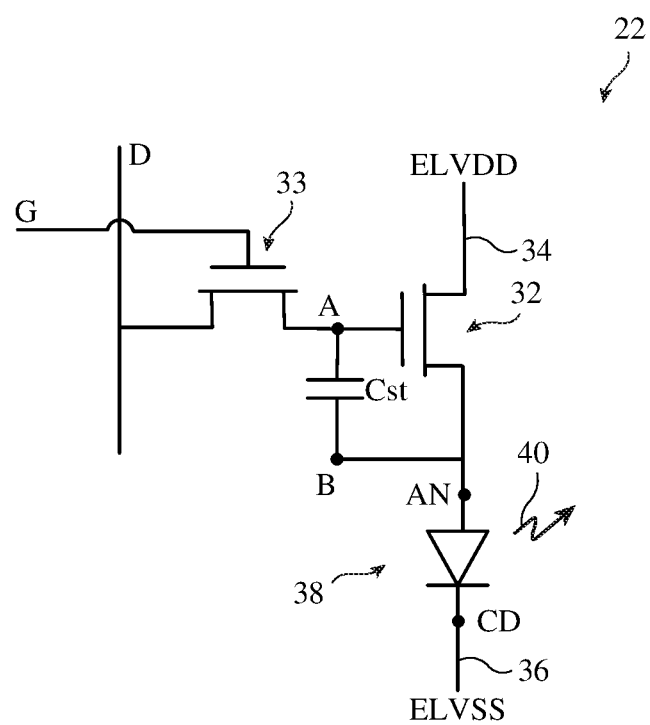
FIG. 3 is a diagram of an illustrative display pixel circuit in accordance with an embodiment.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 32 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 33. When switching transistor 33 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 33 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel may include additional switching transistors, emission transistors in series with the drive transistor, etc. Capacitor Cst may be positioned at other desired locations within the pixel (e.g., between the source and gate of the drive transistor). The display pixel circuit of FIG. 3 is merely illustrative.

Figure 4:
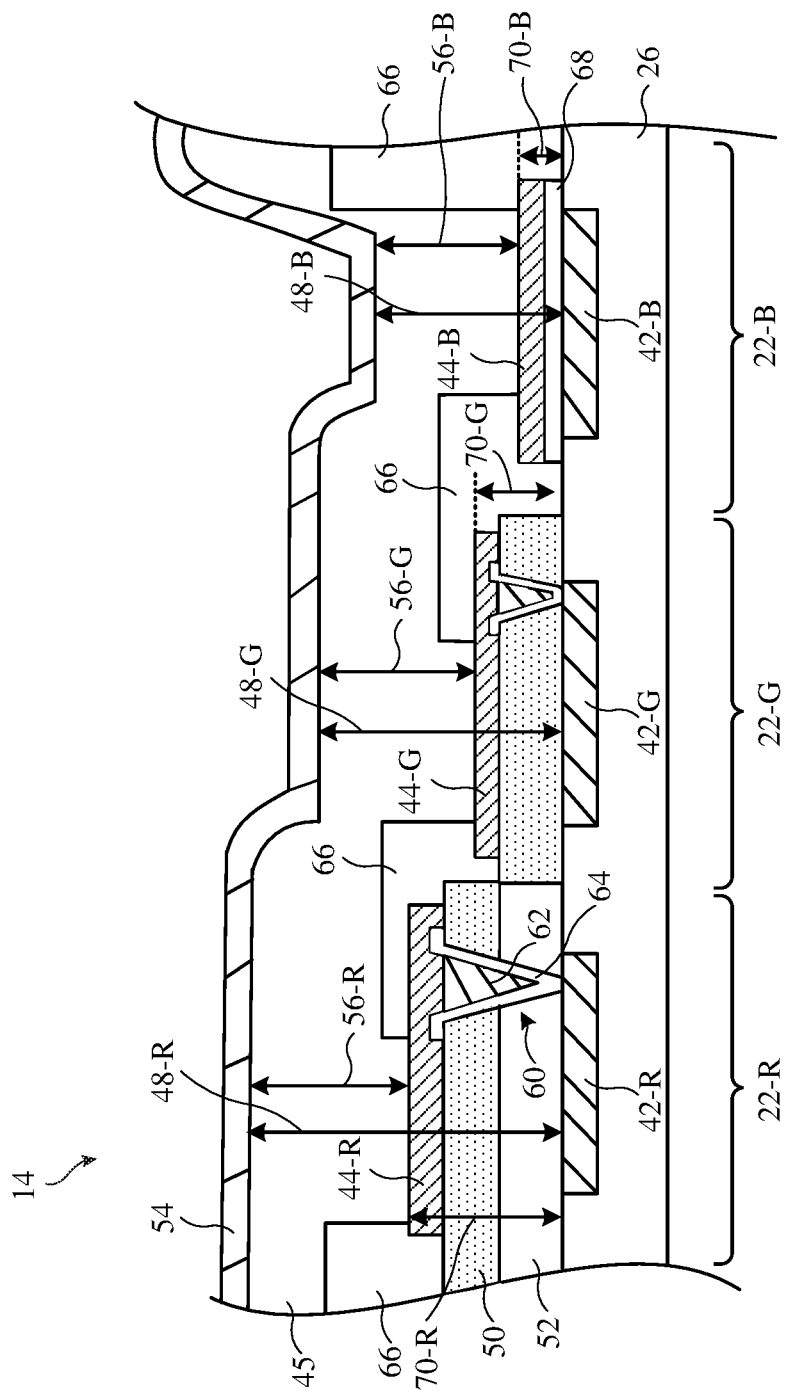
FIG. 4 is a cross-sectional side view of an illustrative display having microcavity organic light-emitting diode pixels including at least one pixel without a via between anode portions in accordance with an embodiment.

FIG. 4 is a cross-sectional side view of an illustrative display with organic light-emitting diode display pixels. As shown, display 14 may include a substrate 26. Substrate 26 may be formed from glass, plastic, polymer, silicon, or any other desired material. Substrate 26 may include thin-film transistor circuitry for applying control signals to the pixels and may therefore sometimes be referred to as a thin-film transistor substrate. FIG. 4 shows a red pixel 22-R, a blue pixel 22-B, and a green pixel 22-G.

Anodes 42 such as anodes 42-R, 42-G, and 42-B may be formed on substrate 26. Anodes 42-R, 42-G, and 42-B may be formed from conductive material and may be covered by OLED layers 45 and cathode 54. OLED layers 45 may include one or more layers for forming an organic light-emitting diode. For example, layers 45 may include one or more of a hole-injection layer (HIL), a hole-transport layer (HTL), an electron-block layer (EBL), an emissive layer (EML), an electron-transport layer (ETL), and an electronic-injection layer (EIL). OLED layers 45 may be formed from white OLED layers (e.g., OLED layers configured to emit white light), combinations of red, green, blue, and/or yellow OLED layers, etc. Cathode 54 may be a conductive layer formed on the OLED layers 45. Cathode layer 54 may form a common cathode terminal (see, e.g., cathode terminal CD of FIG. 3) for all diodes in display 14. Each anode in display 14 may be independently controlled, so that each diode in display 14 can be independently controlled. This allows each pixel 22 to produce an independently controlled amount of light.

In some OLED displays, cathode 54 is entirely (or almost entirely) transparent and anodes 42 may be in direct contact with OLED layers 45. The display of FIG. 4, however, uses an optical cavity to enhance efficiency and color purity in the display. Using optical cavities as in FIG. 4 allows for uniform white OLED layers 45 to provide red, green, and blue light from red pixel 22-R, green pixel 22-G, and blue pixel 22-B respectively. An optical cavity may be formed by reflective layers within the display that are formed on either side of the OLED layers. By tuning the thickness of the optical cavity that includes the OLED layers, each pixel may be optimized to have high emission at a desired wavelength. To form an optical cavity of this type, display 14 in FIG. 4 includes a partially transparent cathode layer 54 and additional anode portions 44.

Cathode layer 54 may be formed from a partially transparent conductive material. In one illustrative example, cathode layer 54 may be formed from a combination of magnesium (Mg) and silver (Ag). Cathode layer 54 may be formed form any other desired conductive material or combination of conductive materials. Cathode 54 may transmit less than 90% of light, may transmit less than 80% of light, may transmit less than 70% of light, may transmit less than 60% of light, may transmit less than 50% of light, may transmit more than 40% of light, may transmit more than 50% of light, may transmit more than 60% of light, may transmit between 40% and 80% of light, may transmit between 45% and 60% of light, may transmit between 60% and 70% of light, may transmit between 50% and 75% of light, etc. Cathode 54 may reflect more than 10% of light, may reflect more than 20% of light, may reflect more than 30% of light, may reflect more than 40% of light, may reflect more than 50% of light, may reflect more than 60% of light, may reflect less than 50% of light, may reflect less than 60% of light, may reflect between 20% and 60% of light, may reflect between 40% and 55% of light, may reflect between 30% and 40% of light, may reflect between 25% and 50% of light, etc.

Cathode layer 54 may define a first boundary for the optical cavity. The other boundary of the optical cavity may be set by anode 42 (sometimes referred to as anode portion 42). Anodes 42-R, 42-G, and 42-B may be formed from a highly reflective material such as aluminum, silver or any other desired conductive material. Each anode 42 may reflect more than 70% of light, more than 80% of light, more than 90% of light, more than 95% of light, more than 99% of light, etc.

Additional layers may be formed over anodes 42 between the anodes and OLED layers 45. However, these additional layers may be transparent and therefore do not disrupt the optical cavity. Because the additional layers are transparent, the boundaries of the optical cavity are still determined by the reflective anode 42 and cathode 54. The presence of the additional transparent layers between anode 42 and cathode 54 may result in an increased distance between the reflective anode 42 and cathode 54 (because the OLED thickness is uniform). FIG. 4 shows how pixel 22-R has an optical cavity with thickness 48-R between anode 42-R and cathode 54. Pixel 22-G has an optical cavity with thickness 48-G between anode 42-G and cathode 54. Pixel 22-B has an optical cavity with thickness 48-B between anode 42-B and cathode 54.

Each optical cavity thickness is tuned to optimize emission of the desired color of light for that pixel. For a given optical cavity thickness, light of a given wavelength will resonate due to multiple reflections off of the walls (e.g., cathode 54 and anode 42) of the optical cavity. The increased emission at the given wavelength caused by resonance within the optical cavity may be referred to as a microcavity effect. Pixels that are optimized to induce this effect (such as the pixels in FIG. 4) may be referred to as microcavity OLED pixels.

Pixel 22-R has an optical cavity thickness 48-R that maximizes emission of red light. Pixel 22-G has an optical cavity thickness 48-G that maximizes emission of green light. Pixel 22-B has an optical cavity thickness 48-B that maximizes emission of blue light. Blue light has a shorter wavelength than green light, which has a shorter wavelength than red light. Generally, the thickness of the optical cavity may be proportional to the wavelength of the type of light that is intended to be emitted. Therefore, thickness 48-B is less than thickness 48-G and thickness 48-G is less than thickness 48-R. This example is merely illustrative and does not necessarily hold true for all display designs, as other factors such as the node of the cavity may influence the optical cavity.

The thickness of each optical cavity is therefore tuned to optimize emission of light. However, changing the thickness of each optical cavity may present difficulties during manufacturing. To reduce complexity and cost in manufacturing microcavity OLED displays, additional anode portions 44 may be included in each pixel. As shown in FIG. 4, red pixel 22-R has an additional anode portion 44-R, green pixel 22-G has an additional anode portion 44-G, and blue pixel 22-B has an additional anode portion 44-B. These additional anode portions 44 (sometimes referred to as supplementary anodes 44, anodes 44, etc.) may be formed from a transparent conductive material. The additional anode portions may be formed from indium tin oxide (ITO) or any other desired transparent conductive material. Because the additional anodes are transparent, they may be used to tune the optical cavity thickness 48 of the pixels without disrupting the optical cavity between anode 42 and cathode 54.

A pixel definition layer 66 may be formed between each pixel. The pixel definition layer may be formed from a non-conducting material and may be interposed between adjacent anodes of the display. The pixel definition layer may be formed from a non-conductive material (that is either opaque or transparent) and may have openings in which the anodes are formed, thereby defining the area of each pixel.

Additional layers may be included between anode portion 44 and anode portion 42 in each pixel. As shown in FIG. 4, first and second dielectric layers 50 and 52 (sometimes referred to as spacers 50 and 52) are included in display 14. Dielectric layer 52 has a portion formed over anode 42-R in red pixel 22-R. Dielectric layer 50 has a first portion that is formed over anode 42-R in red pixel 22-R and a second portion that is formed over anode 42-G in green pixel 22-G. The first portion of dielectric layer 50 is interposed between dielectric layer 52 and supplemental anode 44-R. The second portion of dielectric layer 50 is interposed between anode 42-G and supplemental anode 44-G.

Dielectric layers 50 and 52 as well as supplemental anodes 44 may all be transparent or substantially transparent. This allows the layers to serve as spacers that can have thicknesses chosen to tune the thickness of the optical cavity for each pixel. Dielectric layers 50 and 52 as well as supplemental anodes 44 may transmit more than 90% of incident light, more than 95% of incident light, more than 99% of incident light, more than 99.9% of incident light, etc. Dielectric layers 50 and 52 may be formed from silicon dioxide, silicon oxynitride, another desired oxide material, silicon nitride, or any other desired transparent material.

Dielectric layers 50 and 52 may serve as spacer structures that allow tuning of cavity thickness 48 for each pixel. For ease of manufacturing, it is desirable for a uniform thickness white OLED layer 45 to be formed over each supplemental anode 44. This way, OLED layers 45 may be formed in a single deposition step instead of being patterned to have different thicknesses and/or different color OLED material for each pixel. As shown in FIG. 4, the OLED thickness 56-R of pixel 22-R, the OLED thickness 56-G of pixel 22-G, and the OLED thickness 56-B of pixel 22-B are approximately (e.g., within 5% of) the same.

Without spacer layers 50 and 52, supplemental anodes 44, and conductive spacer 68, having a uniform thickness OLED layer would result in the optical cavity thickness of each pixel being the same. Including dielectric spacers and supplemental anodes as in FIG. 4 allows for the optical cavity thickness to be tuned for a desired color.

Supplemental anodes 44 may be electrically connected to anodes 42. As shown in FIG. 4, a via 60 may be formed that extends through dielectric layers 50 and 52 to electrically connect anode portion 44-R to anode portion 42-R. In FIG. 4, via 60 includes a conductive portion 62 and a conductive liner 64. Another via having the same structure (e.g., with a conductive portion and a conductive liner) is also formed through dielectric layer 50 to electrically connect supplemental anode 44-G to anode 42-G.

Unlike pixels 22-R and 22-G, pixel 22-B may not include a via. Instead, a conductive layer 68 may be interposed between anode portions 42-B and 44-B. Conductive layer 68 may electrically connect anode portion 42-B and anode portion 44-B and may be in direct contact with both anode portion 42-B and anode portion 44-B. Conductive layer 68 (sometimes referred to as conductive spacer 68) may be included to avoid incompatibilities between anode portion 44-B and anode portion 42-B. Conductive layer 68 may also promote better electrical contact between anode portions 44 and anode portions 42. For example, transparent anode portion 44-B may be formed from a material that corrodes when in direct contact with the material of reflective anode portion 42-B. Transparent anode portion 44-B may be formed from ITO and reflective anode portion 42-B may be formed from aluminum, for example. In this example, conductive spacer 68 may be interposed between the anode portions to prevent corrosion.

Conductive layer 68 may be formed from titanium nitride (TiN) or another desired conductive material. Conductive layer 68 may be thin enough to be approximately transparent. For example, conductive layer 68 may have a thickness of less than 10 nanometers, less than 5 nanometers, less than 3 nanometers, between 2 and 5 nanometers, between 1 and 6 nanometers, between 2 and 3 nanometers, between 1 and 3 nanometers, etc. Conductive layer 68 may transmit more than 80% of incident light, more than 90% of incident light, more than 95% of incident light, more than 99% of incident light, more than 99.9% of incident light, etc.

In FIG. 4, no dielectric spacer is formed between anode portion 42-B and anode portion 44-B. Having supplemental anode portion 44-B formed directly over anode portion 42-B with an intervening conductive layer 68 obviates the need for a dielectric layer to be included in the anode stack of pixel 22-B. This is beneficial as a dielectric spacer in the anode stack of the blue pixel would have to be very thin, presenting manufacturing difficulties.

Additionally, having supplemental anode portion 44-B formed directly over anode portion 42-B without an intervening dielectric layer allows for via 60 (e.g., through a dielectric layer) to be omitted in pixel 22-B. Omitting the via in blue pixel 22-B allows for the aperture ratio of the blue pixel to be increased. A pixel's aperture is the area from which light is emitted from the pixel. In the display shown in FIG. 4, each pixel's aperture is defined by pixel definition layers 66 (e.g., the aperture corresponds to areas not covered by the opaque pixel definition layer). Aperture ratio refers to the ratio of a pixel's aperture (e.g., light-emitting area) to the pixel's non-light-emitting area. In general, having a larger aperture ratio is desirable as larger aperture ratios correspond to higher display efficiency and improved display performance.

As shown in FIG. 4, vias 60 in pixels 22-R and 22-G are non-light-emitting areas that are therefore covered by pixel definition layer 66. The presence of via 60 reduces the aperture ratio of the pixel. Omitting via 60 in the blue pixel of FIG. 4 therefore improves the aperture ratio of the blue pixel 22-B.

In some cases, anode portions 42-B and 44-B may be formed from materials that are compatible when in direct contact. For example, anode portion 42-B may be formed from silver and anode portion 44-B may be formed from ITO. In this example, conductive layer 68 may be omitted and anode portion 42-B may be formed in direct contact with anode portion 44-B.

Conductive portion 62 of each via 60 may optionally be formed from the same material as supplemental anode portions 44. For example, if supplemental anode 44-R for pixel 22-R is formed from indium tin oxide, conductive portion 62 of via 60 in pixel 22-R may also be formed from indium tin oxide. However, as discussed in connection with conductive spacer 68, indium tin oxide may not be placed in direct contact with aluminum anode portion 42-R to prevent corrosion. Accordingly, conductive liner 64 may be interposed between conductive via portion 62 and anode portion 42-R. Conductive liner 64 may be formed from the same material as conductive layer 68 (e.g., titanium nitride). Indeed, conductive liner 64 may be formed during the same deposition step as conductive layer 68 during display manufacturing. Similar to how conductive layer 68 may be omitted from the display depending on material compatibility, conductive liner 64 may be omitted if conductive via portion 62 is compatible with anode portions 42.

Each layer in display 14 may have any desired thickness. In some arrangements, supplemental anode portions 44-R, 44-G, and 44-B may have the same thickness. Each supplemental anode portion may have a thickness of less than 100 nanometers, less than 50 nanometers, less than 30 nanometers, less than 20 nanometers, less than 15 nanometers, less than 10 nanometers, greater than 5 nanometers, between 5 and 50 nanometers, between 5 and 100 nanometers, etc. Similarly, each one of dielectric layers 50 and 52 may have any desired thickness (e.g., less than 100 nanometers, less than 50 nanometers, less than 30 nanometers, less than 20 nanometers, less than 15 nanometers, less than 10 nanometers, greater than 5 nanometers, between 5 and 50 nanometers, between 5 and 100 nanometers, etc.).

The supplemental anode and underlying layers between the supplemental anode and anode may be referred to as an anode stack. For example, pixel 22-R has an anode stack that includes supplemental anode 44-R, dielectric layer 50 (sometimes referred to as oxide layer 50), and dielectric layer 52 (sometimes referred to as oxide layer 52). The total thickness 70-R of the anode stack is tuned to determine the total optical cavity thickness 48-R. Pixel 22-G has an anode stack that includes supplemental anode 44-G and dielectric layer 50. The total thickness 70-G of the anode stack is tuned to determine the total optical cavity thickness 48-G. Pixel 22-B has an anode stack that includes supplemental anode 44-B and (optionally) conductive spacer 68. The total thickness 70-B of the anode stack is tuned to determine the total optical cavity thickness 48-B. In one arrangement, the thickness 70-R of the anode stack of red pixel 22-R may be between 100 and 200 nanometers, the thickness 70-G of the anode stack of green pixel 22-G may be between 70 and 100 nanometers, and the thickness 70-B of the anode stack of blue pixel 22-B may be between 10 and 30 nanometers. These thickness values are merely illustrative. Each anode stack may have any desired thickness (e.g., greater than 200 nanometers, between 100 nanometers and 150 nanometers, between 50 and 125 nanometers, less than 100 nanometers, less than 50 nanometers, less than 25 nanometers, less than 20 nanometers, etc.).

The display of FIG. 4 has the aforementioned advantage of omitting the via in pixel 22-B for improved aperture ratio. Additionally, the number of layers deposited is minimized for reduced manufacturing complexity and cost. Dielectric layer 52, dielectric layer 50, a conductive layer for liner 64 and layer 68, and a conductive layer for supplemental anodes 44 may be deposited with generally uniform thicknesses across the display, reducing the need for additional patterning steps.

The example of FIG. 4 in which white OLED layers 45 are uniformly deposited for pixels 22-R, 22-G, and 22-B is merely illustrative. In some designs, each pixel may have corresponding OLED layers of that color. For example, red pixel 22-R may have red OLED layers (e.g., OLED layers that emit red light), green pixel 22-G may have green OLED layers (e.g., OLED layers that emit green light), and blue pixel 22-B may have blue OLED layers (e.g., OLED layers that emit blue light). This type of arrangement may offer efficiency improvements at the cost of increased manufacturing complexity.

Figure 5:
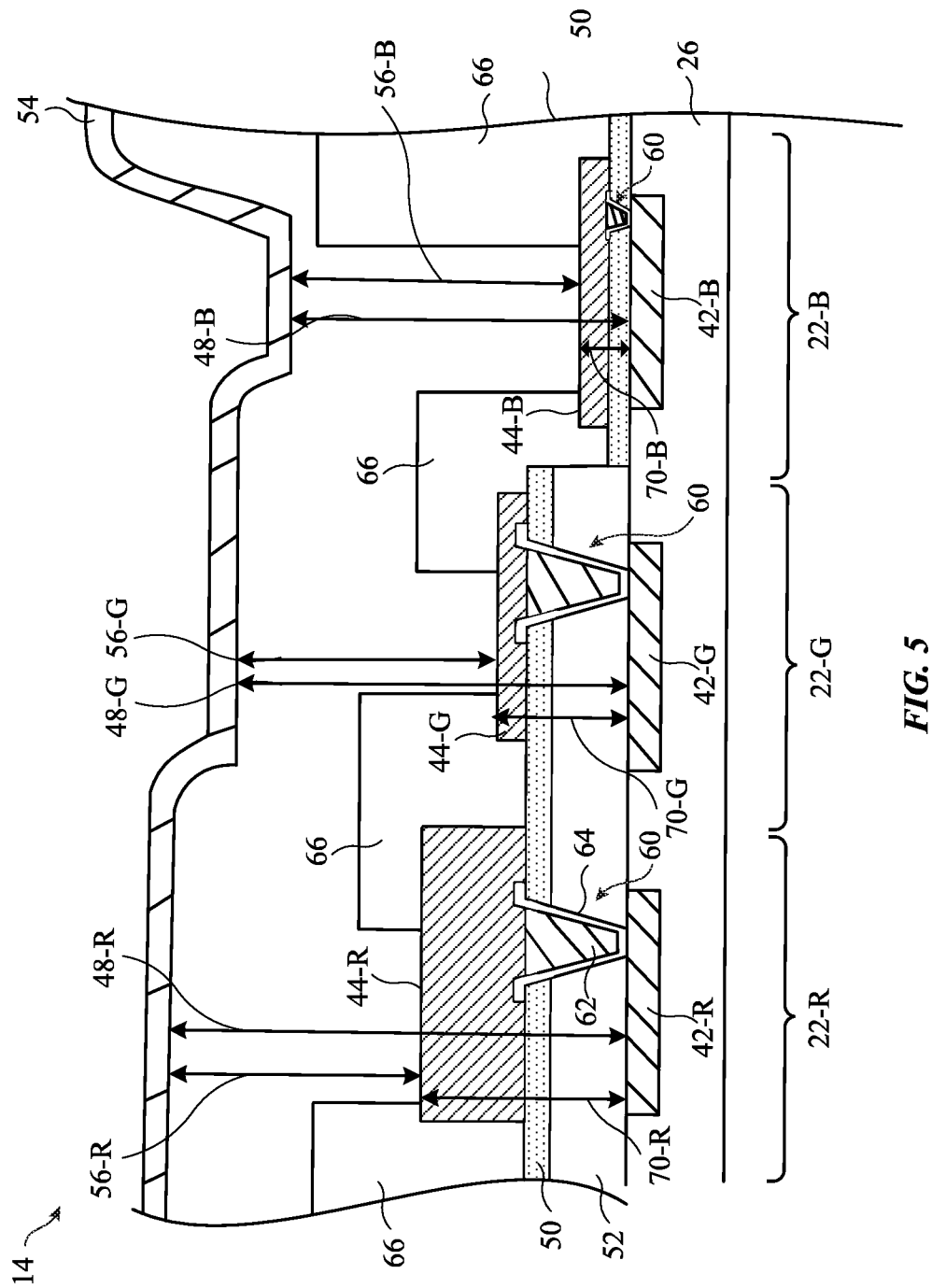
FIG. 5 is a cross-sectional side view of an illustrative display having microcavity organic light-emitting diode pixels that have respective anode portions with different thicknesses in accordance with an embodiment.

FIG. 5 is a cross-sectional side view of a display with microcavity OLED pixels similar to the display of FIG. 4. For simplicity, duplicative descriptions that apply to both FIGS. 4 and 5 will not be repeated herein. In FIG. 5, each pixel includes a transparent supplemental anode 44 similar to as in FIG. 4. However, in FIG. 5 the thicknesses of the supplemental anodes vary. For example, supplemental anode 44-R may have a different (e.g., larger) thickness than supplemental anodes 44-G and 44-B. This allows for the combined thickness of dielectric layers 50 and 52 in pixel 22-R to be reduced while achieving the same anode stack height 70-R.

Reducing the thickness of dielectric layers 50 and 52 may be beneficial because it results in via 60 in pixel 22-R being shorter. Having via 60 extend through thick dielectric layers may present challenges. Manufacturing a via that is both thin and deep may add to manufacturing cost, may add to manufacturing complexity, and may result in reliability issues. The via may be made wider to make manufacturing easier for the same depth, but this sacrifices aperture ratio of the pixel.

By reducing the thickness of dielectric layers 50 and 52 in FIG. 5, the via may be shorter and therefore easier to manufacture without sacrificing aperture ratio. Additionally, the thickness of dielectric layers 50 and 52 in pixels 22-R and 22-G are the same. Therefore, via 60 in pixel 22-R has the same depth as via 60 in pixel 22-G. Consequently, the vias for pixels 22-R and 22-G may be manufactured during the same processing step, lowering the cost and complexity of manufacturing.

By tuning the supplemental anode thickness, the desired anode stack thicknesses 70 and optical cavity thicknesses 48 may remain unaffected even when the thickness of the dielectric layers are reduced.

In FIG. 5, blue pixel 22-B has a supplemental anode 44-B that is separated from anode 42-B by a portion of dielectric layer 50. The blue pixel has a via 60 that extends through the dielectric layer to electrically connect anode portion 44-B to anode portion 42-B. This type of arrangement allows for dielectric layer 50 to have the same thickness in pixels 22-R, 22-G, and 22-B. The thickness of dielectric layer 50 may be selected primarily based on the tuning of the anode stack of pixel 22-B. The thicknesses of dielectric layer 52 and supplemental anodes 44 may then be used to tune the overall thicknesses of the anode stacks for pixels 22-R and 22-G.

Color filter elements may optionally be formed over the pixels of the displays of FIGS. 4 and 5 if desired. For example, a red color filter element may be formed over each red pixel 22-R, a green color filter element may be formed over each green pixel 22-G, and a blue color filter element may be formed over each blue pixel 22-B. Color filter elements may not be included in the display if desired.

Additionally, in FIGS. 4 and 5 examples are shown where continuous OLED layers 45 are formed across the display. This example is merely illustrative. It should be understood that pixel definition layers 66 and/or other structures may be used to form discontinuities in one or more of the OLED layers if desired. Forming discontinuities in the OLED layers may prevent light leakage between pixels.

It should be understood that the arrangements of FIGS. 4 and 5 may be combined if desired. For example, the display of FIG. 5 may have a conductive layer 68 and no via interposed between anode portions 42-B and 44-B instead of a dielectric layer with a via (e.g., pixel 22-B in FIG. 5 may instead have the structure of pixel 22-B in FIG. 4).

In the example of FIG. 4, a conductive spacer 68 is depicted as only being formed in the anode stack of blue pixel 22-B. This example is merely illustrative. If desired, the red and/or green pixels may also include a conductive spacer between a respective anode portion 42 and supplemental anode portion 44. In general, any subset of the red, green, and blue pixels may include a conductive spacer between the anode portions (and omit dielectric spacers between the anode portions).

Figure 6:
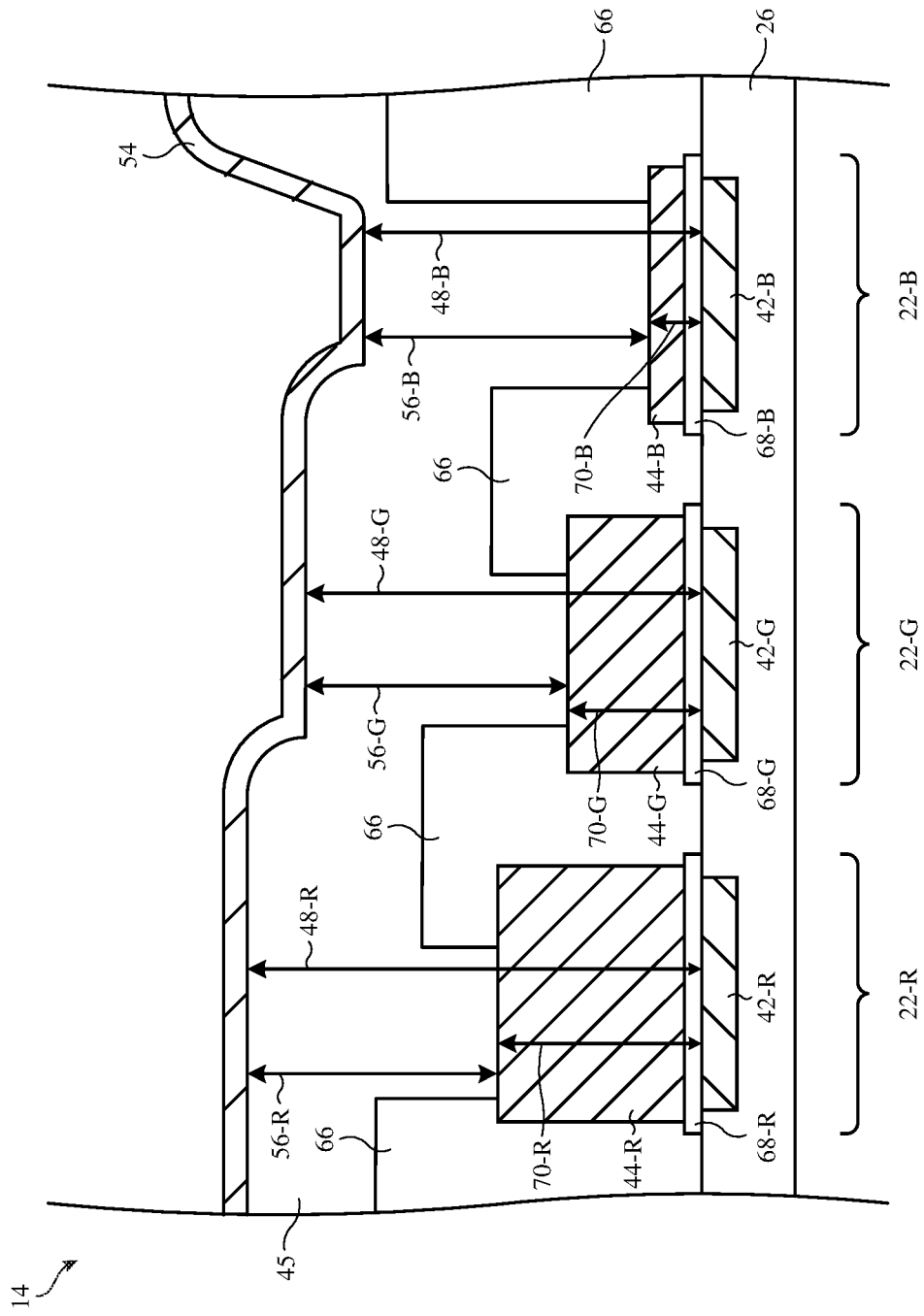
FIG. 6 is a cross-sectional side view of an illustrative display having microcavity organic light-emitting diode pixels including pixels of three colors without a via between anode portions in accordance with an embodiment.

FIG. 6 is a cross-sectional side view of an illustrative display where the red, blue, and green pixels all have a conductive spacer between respective anode portions. For simplicity, duplicative descriptions that apply to FIG. 6 and one or more previous figures will not be repeated herein. In FIG. 6, each pixel includes a transparent supplemental anode 44 similar to as in FIG. 4. However, in FIG. 6 the thicknesses of the supplemental anodes vary. For example, supplemental anode 44-R may have a different (e.g., larger) thickness than supplemental anode 44-G and supplemental anode 44-B. Supplemental anode 44-G may have a different (e.g., larger) thickness than supplemental anode 44-B. Using supplemental anodes 44 of varying thicknesses allows for the total optical cavity thickness 48 to be optimized for each pixel type (e.g., pixel 22-R has an optical cavity thickness 48-R that maximizes emission of red light, pixel 22-G has an optical cavity thickness 48-G that maximizes emission of green light, and pixel 22-B has an optical cavity thickness 48-B that maximizes emission of blue light) while allowing OLED thicknesses 56-R, 56-G, and 56-B to remain approximately the same.

In FIG. 6, there is no intervening dielectric layer between transparent supplemental anode portion 44 and anode portion 42 for each pixel. Instead, a conductive layer 68 may be interposed between anode portions 42 and 44. As shown, a conductive layer 68-R is interposed between anode portion 44-R and anode portion 42-R, a conductive layer 68-G is interposed between anode portion 44-G and anode portion 42-G, and a conductive layer 68-B is interposed between anode portion 44-B and anode portion 42-B. The conductive layers 68 may electrically connect respective anode portions 42 and 44 and may be in direct contact with both anode portion 42 and anode portion 44. Conductive layers 68-R, 68-G, and 68-B (sometimes referred to as conductive spacers) may be included to avoid incompatibilities between anode portions 44 and anode portions 42. Conductive layers 68 may also promote better electrical contact between anode portions 44 and anode portions 42. For example, transparent anode portion 44 may be formed from a material that corrodes when in direct contact with the material of reflective anode portion 42 (e.g., transparent anode portion 44 may be formed from ITO and reflective anode portion 42 may be formed from aluminum). In this example, conductive spacer 68 may be interposed between the anode portions to prevent corrosion.

Each one of conductive layers 68-R, 68-G, and 68-B may be formed from titanium nitride (TiN) or another desired conductive material. Each one of conductive layers 68-R, 68-G, and 68-B may be thin enough to be approximately transparent (e.g., may have a thickness of less than 10 nanometers, less than 5 nanometers, less than 3 nanometers, between 2 and 5 nanometers, between 1 and 6 nanometers, between 2 and 3 nanometers, between 1 and 3 nanometers, etc.). Each one of conductive layers 68-R, 68-G, and 68-B may transmit more than 80% of incident light, more than 90% of incident light, more than 95% of incident light, more than 99% of incident light, more than 99.9% of incident light, etc. Conductive layers 68-R, 68-G, and 68-B may have uniform thicknesses (as in FIG. 6) or may have different thicknesses if desired.

An arrangement of the type shown in FIG. 6 has the benefit of omitting deposition steps for the intervening dielectric layers of FIGS. 4 and 5. Additionally, no conductive via is required through the intervening dielectric layers, allowing for the pixel aperture ratio to be increased relative to when a via is required. If the conductive materials used to form anode portions 42 and 44 are compatible for direct contact, the conductive spacer 68 may be omitted (e.g., from any of the red, green, and blue pixels). A via-less pixel design (e.g., as in all three pixels in FIG. 6 where no intervening dielectric layers are present) may be used for all three pixel color types (as in FIG. 6), one pixel color type (as in FIG. 4), or any two pixel color types.

The foregoing is merely illustrative and various modifications can be made by those skilled in the art without departing from the scope and spirit of the described embodiments. The foregoing embodiments may be implemented individually or in any combination.

What is claimed is:

1. A display comprising:
    a first pixel formed from a first anode, a cathode, and organic light-emitting diode layers, wherein the first anode comprises a first portion in a first layer and a second portion in a second layer, wherein the second portion is electrically connected to the first portion and has a first thickness, wherein the first pixel has an optical cavity defined by a first distance between the first portion and the cathode, and wherein the first pixel includes first and second dielectric layers that are interposed between the first portion of the first anode and the second portion of the first anode; and
    a second pixel formed from a second anode, the cathode, and the organic light-emitting diode layers, wherein the second anode comprises a third portion and a fourth portion, wherein the fourth portion is electrically connected to the third portion and has a second thickness that is different than the first thickness, wherein the second pixel has an optical cavity defined by a second distance between the third portion and the cathode, and wherein the second distance is different than the first distance.

2. The display defined in claim 1, wherein the organic light-emitting diode layers have a given thickness over the second portion of the first anode and wherein the organic light-emitting diode layers have the given thickness over the fourth portion of the second anode.

3. The display defined in claim 1, wherein the first pixel includes a first via that extends through the first and second dielectric layers to electrically connect the first and second portions of the first anode.

4. The display defined in claim 3, wherein the second pixel includes the first and second dielectric layers and wherein the first and second dielectric layers are interposed between the third portion of the second anode and the fourth portion of the second anode.

5. The display defined in claim 4, wherein the second pixel includes a second via that extends through the first and second dielectric layers to electrically connect the third and fourth portions of the second anode.

6. The display defined in claim 5, wherein the first thickness is greater than the second thickness.

7. The display defined in claim 6, wherein the first dielectric layer has a third thickness in the first pixel and a fourth thickness in the second pixel that is the same as the third thickness and wherein the second dielectric layer has a fifth thickness in the first pixel and a sixth thickness in the second pixel that is the same as the fifth thickness.

8. The display defined in claim 7, further comprising:
a third pixel formed from a third anode, the cathode, and the organic light-emitting diode layers, wherein the third anode comprises a fifth portion and a sixth portion, wherein the sixth portion is electrically connected to the fifth portion and has a seventh thickness that is different than the first thickness, wherein the third pixel has an optical cavity defined by a third distance between the fifth portion and the cathode, and wherein the third distance is different than the first and second distances.

9. The display defined in claim 8, wherein the third pixel includes the first dielectric layer, wherein the first dielectric layer is interposed between the fifth portion of the third anode and the sixth portion of the third anode, wherein the first dielectric layer has an eighth thickness in the third pixel that is the same as the third and fourth thicknesses, wherein the first distance is greater than the second distance, wherein the second distance is greater than the third distance, wherein the organic light-emitting diode layers are white organic light-emitting diode layers, wherein the first pixel is a red pixel, wherein the second pixel is a green pixel, and wherein the third pixel is a blue pixel.

10. The display defined in claim 1, further comprising:
a third pixel formed from a third anode, the cathode, and the organic light-emitting diode layers, wherein the third anode comprises a fifth portion and a sixth portion, wherein the sixth portion is electrically connected to the fifth portion and has a third thickness that is different than the first and second thicknesses, wherein the third pixel has an optical cavity defined by a third distance between the fifth portion and the cathode, and wherein the third distance is different than the first and second distances.

11. The display defined in claim 10, wherein the first pixel further comprises a first conductive layer that is interposed between and in direct contact with the first portion and the second portion, wherein the second pixel further comprises a second conductive layer that is interposed between and in direct contact with the third portion and the fourth portion, and wherein the third pixel further comprises a third conductive layer that is interposed between and in direct contact with the fifth portion and the sixth portion.

12. A display comprising:
a pixel that includes:
an anode comprising a first portion that is formed from a first material and a second portion that is formed from a second material that is different than the first material;
a cathode;
organic light-emitting diode layers interposed between the second portion of the anode and the cathode; and
a conductive spacer, wherein the conductive spacer is formed from a third material that is different than the first and second materials, wherein the conductive spacer is interposed between and electrically connects the first and second portions of the anode, and wherein the pixel has an optical cavity defined by a distance between the first portion of the anode and the cathode.

13. The display defined in claim 12, wherein the pixel is a first pixel, wherein the anode is a first anode, and wherein the display further comprises:
a second pixel that includes:
a second anode comprising a third portion and a fourth portion;
the cathode;
the organic light-emitting diode layers, wherein the organic light-emitting diode layers are interposed between the fourth portion of the second anode and the cathode; and
at least one dielectric layer that is interposed between the third and fourth portions of the second anode.

14. The display defined in claim 13, wherein the at least one dielectric layer comprises a first dielectric layer and wherein the first dielectric layer is the only dielectric layer interposed between the third and fourth portions of the second anode.

15. The display defined in claim 14, further comprising:
a third pixel that includes:
a third anode comprising a fifth portion and a sixth portion;
the cathode;
the organic light-emitting diode layers, wherein the organic light-emitting diode layers are interposed between the sixth portion of the third anode and the cathode; and
two dielectric layers that are interposed between the fifth and sixth portions of the third anode.

16. The display defined in claim 15, wherein the second pixel includes a first via that extends through the first dielectric layer to couple the third portion of the second anode to the fourth portion of the second anode, wherein the third pixel includes a second via that extends through the two dielectric layers to couple the fifth portion of the third anode to the sixth portion of the third anode, and wherein the first pixel does not include any dielectric layers between the first portion of the first anode and the second portion of the first anode.

17. The display defined in claim 16, wherein the optical cavity is a first optical cavity and the distance is a first distance, wherein the second pixel has a second optical cavity defined by a second distance between the third portion of the second anode and the cathode, wherein the third pixel has a third optical cavity defined by a third distance between the fifth portion of the third anode and the cathode, wherein the first distance is less than the second distance, and wherein the second distance is less than the third distance.

18. A display comprising:
   first and second pixels having a common cathode formed over organic light-emitting diode layers, wherein each of the first and second pixels comprises:
   a first anode portion;
   a second anode portion that contacts the organic light-emitting diode layers, wherein the organic light-emitting diode layers have a thickness over the second anode portion of the first pixel and wherein the organic light-emitting diode layers have the thickness over the second anode portion of the second pixel; and
   at least one dielectric layer interposed between the first and second anode portions, wherein the second anode portion of the first and second pixels have different thicknesses.

19. The display defined in claim 18, wherein the first anode portion of each of the first and second pixels is reflective and wherein the second anode portion of each of the first and second pixels is transparent.

* * * * *